United States Patent
Lakshmikanthan et al.

(10) Patent No.: US 8,451,153 B1
(45) Date of Patent: *May 28, 2013

(54) AUTO-MEASUREMENT AND CALIBRATION OF DC RESISTANCE IN CURRENT SENSING APPLICATIONS

(75) Inventors: Srikanth Lakshmikanthan, Milpitas, CA (US); Eduardo M. Lipiansky, Danville, CA (US); Udaya Kiran Ammu, Mountain View, CA (US)

(73) Assignee: Google Inc., Mountain View, CA (US)

( * ) Notice: Subject to any disclaimer, the term of this patent is extended or adjusted under 35 U.S.C. 154(b) by 196 days.

This patent is subject to a terminal disclaimer.

(21) Appl. No.: 12/968,828

(22) Filed: Dec. 15, 2010

Related U.S. Application Data

(63) Continuation of application No. 12/786,706, filed on May 25, 2010, now Pat. No. 7,986,254, which is a continuation of application No. 12/315,655, filed on Dec. 5, 2008, now Pat. No. 7,741,983.

(51) Int. Cl.
*H03M 1/10* (2006.01)

(52) U.S. Cl.
USPC .......................................... 341/120; 702/85

(58) Field of Classification Search
USPC .................. 341/120, 118; 702/85; 324/76.79, 324/130; 363/21.18
See application file for complete search history.

(56) References Cited

U.S. PATENT DOCUMENTS

| | | |
|---|---|---|
| 6,768,295 B2 | 7/2004 | Santin et al. |
| 6,771,052 B2 | 8/2004 | Ostojic |
| 6,781,354 B2 | 8/2004 | Zhang |
| 6,954,054 B2 | 10/2005 | Brown |
| 7,054,170 B2 | 5/2006 | Yang et al. |
| 7,173,400 B2 | 2/2007 | Morioka |
| 7,327,129 B2 | 2/2008 | Chen et al. |
| 7,580,805 B2 | 8/2009 | Tabaian et al. |
| 7,741,983 B1 * | 6/2010 | Lakshmikanthan et al. .. 341/120 |
| 7,969,129 B2 | 6/2011 | Kudo |
| 7,986,254 B1 * | 7/2011 | Lakshmikanthan et al. .. 341/120 |
| 2004/0076024 A1 | 4/2004 | Liu et al. |
| 2005/0184713 A1 | 8/2005 | Xu et al. |

(Continued)

FOREIGN PATENT DOCUMENTS

WO 2006122235 11/2006

OTHER PUBLICATIONS

Zhang et al., "Online Calibration of Mosfet On-State Resistance for Precise Current Sensing," IEEE Power Electronics Letter, vol. 2, No. 3, Sep. 2004, pp. 100-103.

(Continued)

*Primary Examiner* — Peguy Jean Pierre
(74) *Attorney, Agent, or Firm* — Lerner, David, Littenberg, Krumholz & Mentlik, LLP

(57) ABSTRACT

The present invention pertains to calibration in current sensing applications. Power conversion systems such as those used in computer architectures may employ step down converters such as buck converters or other types of converters. The present invention provides calibration processes and devices to account for various parasitic resistances which are found in such systems. A calibration circuit may be coupled to the buck converter or other power conversion to determine a calibrated voltage signal for the output of the power converter. An effective DC resistance may be determined and programmed for use by a control device used. In this way, the parasitic resistances are taken into account to obtain an accurate estimate of the actual current. In turn, this enables power converters and other devices to operate within specification requirements.

19 Claims, 5 Drawing Sheets

U.S. PATENT DOCUMENTS

| | | |
|---|---|---|
| 2007/0262756 A1 | 11/2007 | Valley et al. |
| 2008/0310200 A1 | 12/2008 | Maksimovic et al. |
| 2009/0224731 A1 | 9/2009 | Tang et al. |

OTHER PUBLICATIONS

Lenk, "Application Bulletin AB-20, Optimum Current Sensing Techniques in CPU Converters," Jan. 20, 1999, 4 pages, www.fairchildsemi.com.

Dong et al., "DCR Current Sensing Method for Achieving Adaptive Voltage Positioning (AVP) in Voltage Regulators with Coupled Inductors," The Bradley Department of Electrical and Computer Engineering, Virginia Polytechnic Institute and State university, before the date of this instant application, 7 pages.

Nagaraja et al.,"Design and Analysis of Four-Phase Synchronous Buck Converter for VRM Applications," Indian Institute of Technology, Kharagpur, 721302, Dec. 20-22, 2004, pp. 575-580.

RichTek, "VRM 8.5 Synchronous PWM Buck Converter Controller and Output Voltage Monitor," Mar. 2004, 8 pages.

AN2239 Application Note, "Maximizing Synchronous Buck Converter Efficiency with Standard STripFETsä with Integrated Schottky diodes," Oct. 2005, 14 pages.

International Search Report and Written Opinion, PCT/US2011/036954, date of mailing Dec. 23, 2011.

\* cited by examiner

AUTO-MEASUREMENT AND CALIBRATION OF DC RESISTANCE IN CURRENT SENSING APPLICATIONS

CROSS REFERENCE TO RELATED APPLICATIONS

This application is a continuation of U.S. application Ser. No. 12/786,706, filed on May 25, 2010, which is a continuation of U.S. application Ser. No. 12/315,655, filed on Dec. 5, 2008 and issued on Jun. 22, 2010 as U.S. Pat. No. 7,741,983, the entire disclosures of which are incorporated herein by reference.

BACKGROUND OF THE INVENTION

1. Field of the Invention

The present invention relates generally to measurement and calibration of resistance in current sensing applications, and is particularly suited to measurement and calibration of inductor resistance, PCB resistance and relates parasitic resistances.

2. Description of Related Art

Power conversion is an important process which occurs in a variety of systems for many different applications. One such application is in a power converter for a computing system. In a power converter application, a buck converter may be used to provide a stepped-down DC voltage to various components in the system, including the system processor(s). Such systems may benefit by sensing the current at the output of the converter. For instance, DC/DC output current sensing allows for measurement of the power consumed by the load. Current sensing also permits management of load line requirements for processors as well as measurement of power output to determine system efficiency.

In view of this, a variety of current sensing techniques have been developed. For instance, an output current sense resistor may be used in combination with the output inductor of the buck converter. Another technique senses the current through a MOSFET of the buck converter. Yet another technique involves sensing the output current by using the DC resistance of the output inductor itself.

Selecting from among such techniques may involve design choices, such as cost and size of components, as well as tolerance levels and sensing accuracy. The DC resistance ("DCR") of the inductor(s) of power conversion components may have an impact on current sensing. However, DCR and other parasitic resistances may vary based upon a number of factors, including manufacturing tolerances, variation of resistance in a printed circuit board ("PCB"), variations due to solder connections, temperature variations, etc.

Each of these factors may introduce errors into the current sensing process. This may lead to improper voltage provided by the power supply, which in turn may affect the reliability of processors in the computer system. Merely measuring sample circuit boards during manufacture may not provide an adequate baseline DCR for all circuit boards being produced. Resistance measurements may be on the order of milli-ohms to micro-ohms, and there may be lots of variation between different circuit boards.

Systems and methods providing improved current sensing are provided herein.

SUMMARY OF THE INVENTION

In accordance with an embodiment of the present invention, a method of measurement and calibrating a power conversion circuit which includes an input power node, an output power node and a capacitive device coupled between the input and output power nodes is provided. The method comprising measuring a voltage differential across the capacitive device to derive a pre-calibration voltage; setting a pair of switching elements of a calibration circuit tied to the output power node to permit a fixed known current to flow through the pair of switching elements; measuring a voltage across a resistance element of the calibration circuit, the resistance element being tied to at least one of the pair of switches; calibrating any errors associated with the power conversion circuit based on the measured voltage across the resistance element; re-measuring the voltage differential across the capacitive device after calibrating for any errors to derive a calibration voltage; deriving a calibrated voltage from the calibration voltage and the pre-calibration voltage; and storing the calibrated voltage in memory for use during operation of the power conversion circuit.

In one alternative, the power conversion circuit is a DC to DC power conversion circuit having an inductance device tied to the input and output power nodes. Here, the method further comprises measuring a temperature of the inductance device; and performing temperature compensation using the inductance device temperature to obtain a temperature-compensated DC resistance for the power conversion circuit. In this case, the temperature-compensated DC resistance may be programmed into memory of a controller for the power conversion unit.

In another alternative, the method further comprises electrically isolating the pair of switching elements of the calibration circuit from the power conversion unit after deriving the calibrated voltage.

In accordance with another embodiment of the present invention, a measurement and calibration device is provided. The device is usable with a power conversion device including an input power node, an output power node and a capacitive device tied to the input and output power nodes. The measurement and calibration device comprises a resistance element, a first switching element and a second switching element. The resistance element is tied at a first side thereof to the output power node. The first switching element has a first connection tied to a second side of the resistance element, a second connection tied to a controller for managing the power conversion device and a third connection tied to a current limiting resistor. The second switching element has a first connection tied to the current limiting resistor and a second connection tied to the controller. Upon application of a fixed current across the current limiting resistor, the measurement and calibration device obtains a voltage differential across the capacitive device to derive a pre-calibration voltage; sets the first and second switching elements to permit a fixed current to flow through the pair of switching elements; measures a voltage across the resistance element of the calibration circuit; calibrates any errors associated with the power conversion device based on the measured voltage across the resistance element; re-measures the voltage differential across the capacitive device after calibrating for any errors to derive a calibration voltage; derives a calibrated voltage from the calibration voltage and the pre-calibration voltage; and stores the calibrated voltage in memory for use during operation of the power conversion circuit.

In one alternative the measurement and calibration device includes the controller. In another alternative, upon deriving the calibrated voltage the first and second switching elements are electrically isolated from the power conversion device.

In a further alternative, the first switching element is a transistor having its drain tied to the second side of the resistance element, its gate tied to the controller for managing the power conversion device, and its source tied to the current limiting resistor. And the second switching element is a transistor having its drain tied to the current limiting resistor and its source tied to the controller.

In another alternative, the measurement and calibration device further comprises a thermistor for measuring a temperature of the power conversion device. Here, the measurement and calibration device is further operable to perform temperature compensation using the temperature measured by the thermistor to obtain a temperature-compensated DC resistance for the power conversion device.

In accordance with a further embodiment of the present invention, a measurement and calibration architecture is provided. The architecture is useable with a power conversion device including an input power node, an output power node and a capacitive device tied to the input and output power nodes. The architecture comprises a controller, a resistance element and first and second switching elements. The controller manages operation of the power conversion device. The resistance element is tied at a first side thereof to the output power node. The first switching element has a first connection tied to a second side of the resistance element, a second connection tied to the controller and a third connection tied to a ground node. And the second switching element has a first connection tied to the ground node and a second connection tied to the controller. The controller is operable to apply a fixed current across the capacitive device of the power conversion device, to obtain a voltage differential across the capacitive device to derive a pre-calibration voltage, to set the first and second switching elements to permit a fixed current to flow through the pair of switching elements, to measure a voltage across the resistance element, to calibrate any errors associated with the power conversion device based on the measured voltage across the resistance element, to re-measure the voltage differential across the capacitive device after calibrating for any errors to derive a calibration voltage, to derive a calibrated voltage from the calibration voltage and the pre-calibration voltage, and to store the calibrated voltage in memory for use during operation of the power conversion circuit.

In one alternative, the measurement and calibration architecture and the power conversion device are fabricated on a single PCB. In another alternative, the power conversion device is a single phase buck converter. In a further alternative, the buck converter is a multi-phase buck converter. And in another alternative, the calibration architecture and the power conversion device are fabricated on separate PCBs.

In accordance with another embodiment of the present invention, a method of measuring and calibrating resistance in an electronic circuit board having an input node and an output node is provided. The method comprises measuring a voltage between the input and output nodes to derive a first baseline voltage $V_{Rpch\_before\_cal}$; measuring a voltage across a calibration resistor $R_{\_PCB\_CAL}$ to derive a second baseline voltage $V_{Rcal\_before\_cal}$, the calibration resistor being tied at a first end thereof to a switching element and to a second end thereof to ground; activating the switching element so that the first end of the calibration resistor is electrically connected to the output node; upon activation of the switching element, re-measuring the voltage between the input and output nodes to derive a first calibration voltage $V_{\_Rpcb\_cal}$; upon activation of the switching element, re-measuring the voltage across the calibration resistor to derive a second calibration voltage $V_{Rcal\_cal}$; determining a calibration current $I_{\_cal}$ according to the equation: $I_{\_cal}=(V_{Rcal\_cal}-V_{Rcal\_before\_cal})/R_{\_PCB\_CAL}$; determining an effective resistance $R_{\_pcb}$ of a portion of the electronic circuit board between the input and output nodes according to the equation: $R_{\_pcb}=(V_{Rpcb\_cal}-V_{Rpcb\_before\_cal})/I_{\_cal}$; and storing the effective resistance $R_{\_pcb}$ in memory.

In an alternative, the method further comprises repeating the steps of measuring the first and second baseline voltages, deriving the first and second calibration voltages, determining the calibration current, and determining the effective resistance to obtain an average effective resistance.

In another alternative, the method further comprises measuring a thermistor voltage to obtain a temperature-calibrated voltage $V_{\_PCB\_TEMP\_cal}$. Here, the effective resistance $R_{\_pcb}$ corresponds to the temperature associated with the $V_{\_PCB\_TEMP\_cal}$ voltage.

In accordance with a further embodiment of the present invention, a measurement and calibration device for use with an electronic circuit board having an input node and an output node is provided. The measurement and calibration device comprises a controller, a switching element and a calibration resistor. The controller is for managing operation of the calibration device. The switching element has a first connection electrically connected to the output node. And the calibration resistor is tied at a first side thereof to the output power node through the switching element and tied at a second side thereof to ground. The controller is operable to measure a voltage between the input and output nodes to derive a first baseline voltage $V_{Rpcb\_before\_cal}$; measure a voltage across the calibration resistor to derive a second baseline voltage $V_{Rcal\_before\_cal}$; activate the switching element so that the first side of the calibration resistor is electrically connected to the output node; upon activation of the switching element, re-measure the voltage between the input and output nodes to derive a first calibration voltage $V_{\_Rpcb\_cal}$; upon activation of the switching element, re-measure the voltage across the calibration resistor to derive a second calibration voltage $V_{Rcal\_cal}$; determine a calibration current $I_{\_cal}$ according to the equation: $I_{\_cal}=(V_{Rcal\_cal}-V_{Rcal\_before\_cal})/R_{\_PCB\_CAL}$, wherein $R_{\_PCB\_CAL}$ represents a known resistance of the calibration resistor; determine an effective resistance $R_{\_pcb}$ of a portion of the electronic circuit board between the input and output nodes according to the equation: $R_{\_pcb}=(V_{Rpcb\_cal}-V_{Rpcb\_before\_cal})/I_{\_cal}$; and store the effective resistance $R_{\_pcb}$ in memory.

In an alternative, the controller is further operable to repeat the steps of measuring the first and second baseline voltages, deriving the first and second calibration voltages, determining the calibration current, and determining the effective resistance to obtain an average effective resistance.

In another alternative, the device further comprises a thermistor electrically coupled to the input node of the electronic circuit board. In this case, the controller is further operable to measure a thermistor voltage of the thermistor to obtain a temperature-calibrated voltage $V_{PCB\_TEMP\_cal}$. The effective resistance $R_{\_pcb}$ corresponds to the temperature associated with the $V_{\_PCB\_TEMP\_cal}$ voltage.

In another embodiment, a method of measurement and calibrating a power conversion circuit is provided. The method comprises measuring a voltage differential across a capacitive device to derive a pre-calibration voltage; measuring a voltage across a resistance element of a calibration circuit; calibrating any errors associated with the power conversion circuit based on the measured voltage; re-measuring the voltage differential across the capacitive device after calibrating for any errors; upon re-measuring, deriving a calibrated voltage based on the pre-calibration voltage and the re-measured voltage differential; and storing the calibrated voltage in memory for use during operation of the power conversion circuit.

In one example, the power conversion circuit includes an inductance device and the method further comprises performing temperature compensation for the inductance device's temperature. In an alternative, the method further comprises storing temperature compensation information obtained during the temperature compensation in the memory. In this case, the method may further comprise managing operation of the power conversion circuit using the stored calibrated voltage and the temperature compensation information.

In a further embodiment, a measurement and calibration architecture for use with a power conversion device is provided. The measurement and calibration architecture comprises resistance means coupled to an output power node of the power conversion device, switching means coupled to the resistance means, and controller means coupled to the resistance means and the switching means. The controller means is for applying a fixed current to the power conversion device, obtaining a voltage differential to derive a pre-calibration voltage, setting the switching means to permit a fixed current to flow therethrough, measuring a voltage across the resistance means, calibrating errors based on the measured voltage, re-measuring the voltage differential to derive a calibration voltage, and deriving a calibrated voltage from the calibration voltage and the pre-calibration voltage.

In one example, the controller means is operable to store the calibrated voltage in memory for use during operation of the power conversion circuit. Here, the controller means is desirably operable to manage operation of the power conversion circuit using the stored calibrated voltage.

In another example, the power conversion device is a single phase buck converter. In a further example, the power conversion device is a multi-phase buck converter. In yet another example, the controller means is further operable to perform temperature compensation for the power conversion device. In this case, the architecture may further comprise means for measuring a temperature-compensated DC resistance for the power conversion device and providing the temperature-compensated DC resistance to the controller means for the temperature compensation.

In an alternative example, the switching means comprises first and second switching elements. Here, the first switching element has a first connection coupled to the resistance element, a second connection coupled to the controller means and a third connection tied to a ground node. The second switching element has a first connection coupled to the ground node and a second connection coupled to the controller means. In one example, the controller means is further operable to electrically isolate the first and second switching elements from the power conversion device after the calibrated voltage is derived.

In yet another embodiment, a method of measuring and calibrating resistance in electronic circuitry is provided. The method comprises measuring a voltage between input and output nodes of the electronic circuitry to derive a first baseline voltage; measuring a voltage across a calibration resistor to derive a second baseline voltage; re-measuring the voltage between the input and output nodes to derive a first calibration voltage; re-measuring the voltage across the calibration resistor to derive a second calibration voltage; determining a calibration current based on the first and second calibration voltages and the resistance of the calibration resistor; determining an effective resistance of a selected section of the electronic circuitry; and storing the effective resistance in memory.

In one example, the method further comprises determining an average effective resistance for the electronic circuitry. In another example, the method further comprises determining a temperature-calibrated voltage. Here, the effective resistance corresponds to a temperature associated with the temperature-calibrated voltage. In yet another example, the method further comprises electrically coupling a switching element to the calibration resistor for measuring the second baseline voltage. In this case, the method may further comprise electrically isolating the power conversion device from the switching element after the calibrated voltage is derived.

DETAILED DESCRIPTION

The aspects, features and advantages of the present invention will be appreciated when considered with reference to the following description of preferred embodiments and accompanying figures. The same reference numbers in different drawings may identify the same or similar elements. Furthermore, the following description does not limit the present invention; rather, the scope of the invention is defined by the appended claims and equivalents.

Figure 1:
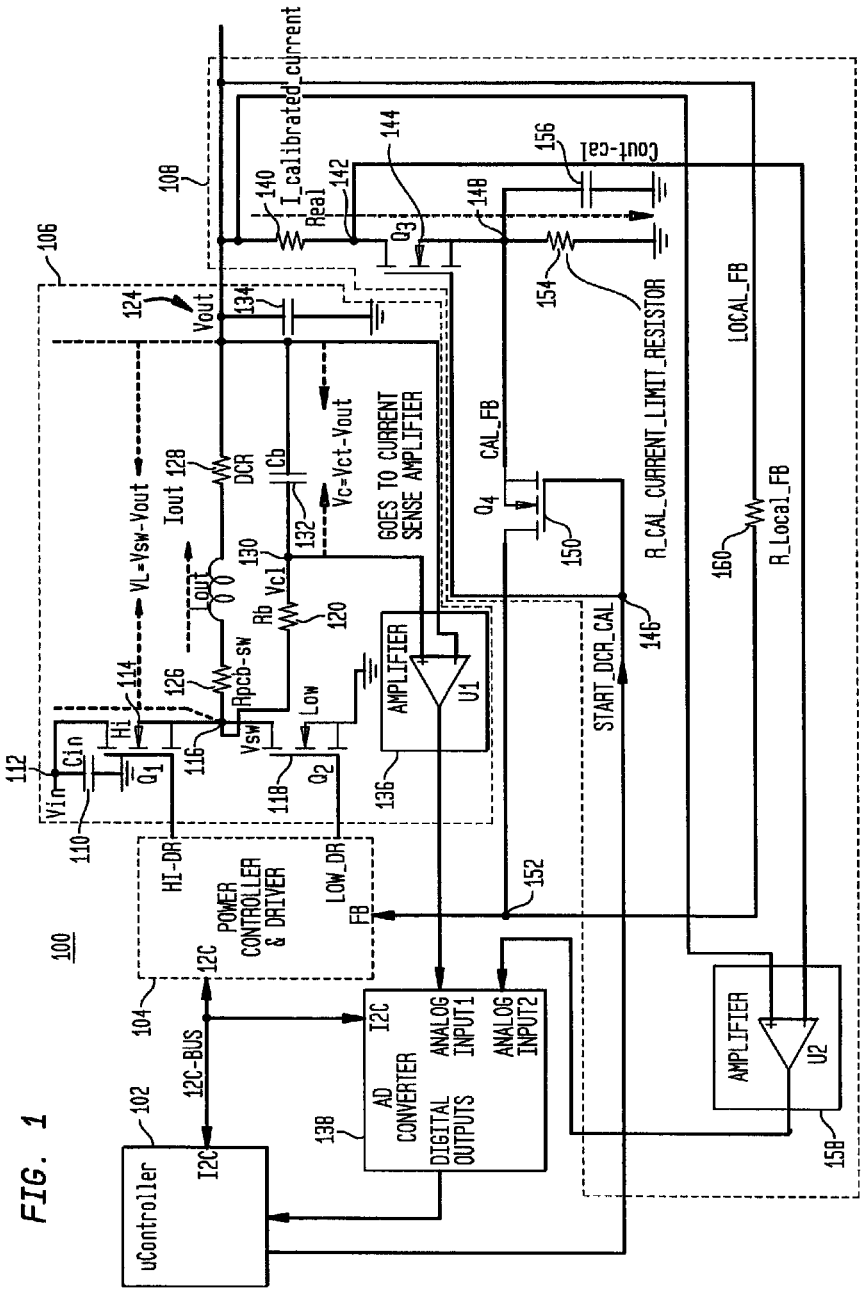
FIG. 1 illustrates a measurement and calibration architecture in accordance with aspects of the present invention.

FIG. 1 provides an embodiment of a current sensing measurement and calibration architecture 100. As shown, the architecture 100 may include a system controller such as microcontroller 102, a power controller/driver 104, a buck converter circuit 106 and a measurement and calibration circuit 108. For ease of illustration, certain lines in the architecture 100 are shown as crossing. However, only intersecting lines attached by a node indicator (e.g., illustrated as a rectangular intersection point) are electrically coupled to one another.

The buck converter circuit 106 may include a first capacitor ($C_{in}$) 110 coupled to a node 112 at a first end and connected to ground at the other end. In this example illustrating a MOSFET architecture, a first transistor $Q_1$ or 114 has its drain terminal tied to the node 112, its gate terminal tied to an output ("HI-DR") of the power controller/driver 104, and its source terminal tied to node 116. A second transistor $Q_2$ or 118 is also tied to the node 116 at via its drain terminal. The gate terminal of the second transistor 118 is tied to another output ("LOW$_{DR}$") of the power controller/driver 104. And the source terminal of the second transistor 118 is tied to ground.

As shown, the node 116 is also tied to a second resistor ("$R_b$") 120 as well as to inductor ("$L_{out}$") 122. A thermistor (not shown) may be coupled to the inductor 122 to determine the temperature of the component. The second end of the inductor 122 is tied to node 124.

Figure 2:
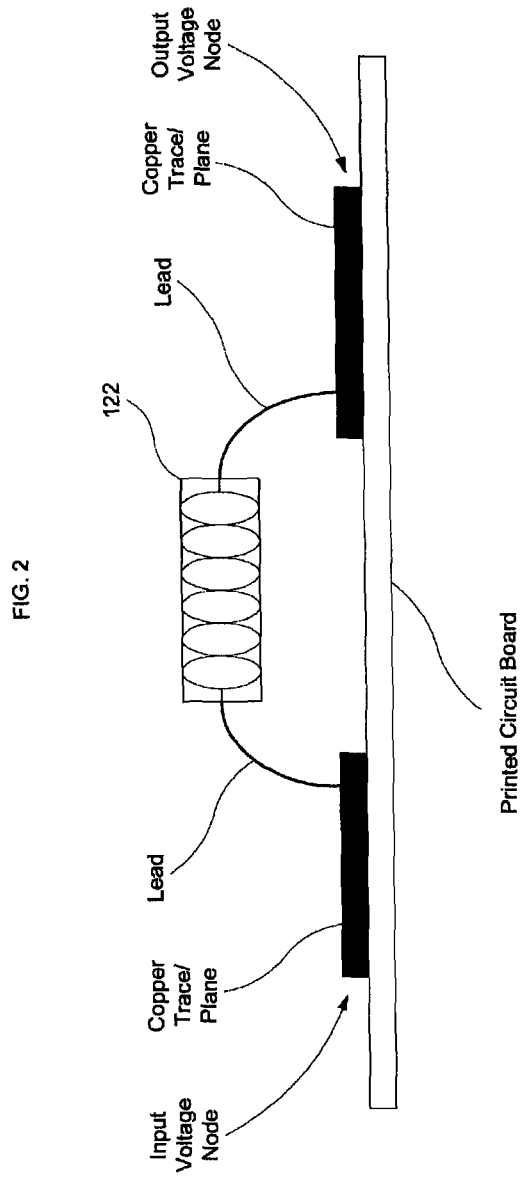
FIG. 2 illustrates parasitic resistances in an exemplary circuit board application.

As shown, the inductor 122 may be modeled with multiple resistances including $R_{pcb-sw}$ 126 and DCR 128. It should be understood that $R_{pcb-sw}$ 126 and DCR 128 represent different types of resistances of the hardware and are not separate physical resistors. These features are further illustrated in the schematic representation of FIG. 2.

As shown in this figure, the inductor 122 is connected to a printed circuit board by a pair of leads tied to copper traces/planes. The total effective resistance between the input and output voltage nodes (e.g., nodes 116 and 124 of FIG. 1), is found by determining the inductor DCR (shown as DCR 128 of FIG. 1) and other parasitic resistances (shown as $R_{pcb-sw}$ 126 of FIG. 1). The DCR accounts for the inductor wire resistance including both leads. Other parasitic resistances include those due to the copper traces or plane resistive paths as well as those due to the PCB and contact resistance between both inductor leads and the trace/place to which the inductor is attached.

Returning to FIG. 1, the other end of the resistor 120 is tied to node 130. A first side of capacitor ("$C_b$") 132 is tied to the node 130 while a second side of capacitor 132 is tied to the node 124. Also tied to the node 124 is capacitor ("Cout") 134.

As shown, a differential amplifier 136 may have two inputs, the positive input tied to node 130 and the negative input tied to node 124. The differential amplifier 136 may include an output that is coupled to the microcontroller 102 through an A/D converter 138.

Measurement and calibration circuit 108 may include, as shown, a resistor ("$R_{cal}$") 140 tied at a first end to node 124 and at a second end to node 142. A switching element such as transistor 144 ("$Q_3$") has its drain terminal tied to the node 142. The gate of the transistor 144 may be tied to the controller 102 via node 146. The source of the transistor 144 may be tied to node 148. Another switching element such as transistor 150 ("$Q_4$") may have its gate tied to the node 146, its drain tied to the node 152, and its source tied to node 148. The node 152 may connect to a feedback connection ("FB") of the power controller/driver 104 as shown.

Also tied to node 148 is a first end of resistor ("R_Cal_Current_Limit_Resistor") 154, while a second end of the resistor 154 may be tied to ground. Similarly, a capacitor ("$C_{out-cal}$") 156 may be placed in parallel with resistor 154 as shown.

The measurement and calibration circuit 108 may further include a differential amplifier 158 having a positive input tied to node 124 and a negative input tied to node 142. The differential amplifier 158 may issue an output signal to the controller 102 through the A/D converter 138. Furthermore, a resistor ("R_Local_FB") 160 may be installed between node 124 and node 152.

In operation, an input voltage ("$V_{in}$") may be applied at node 112 and an output voltage ("$V_{out}$") may be obtained at node 124. As shown in FIG. 1, the measurement and calibration circuit is preferably coupled to node 124. This configuration enables measurement and calibration of the "effective" DC resistance of the inductor 122, which as explained above includes the inductor's DCR as well as the resistances due to copper traces or plane resistive paths, including contact resistances.

During startup or at another time, the microcontroller 102, power controller/driver 104 or other control component may initiate a DCR measurement and calibration process in accordance with aspects of the present invention. In one embodiment, a voltage regulator is loaded with a known fixed current, e.g., "I_calibration" and then measuring the voltage ("$V_c$") across capacitor $C_b$ 132, for instance by measuring the voltage difference between nodes 130 and 124.

The voltage $V_c$ is then divided by the calibration current to give an effective DCR for the circuit 100. The calibration current may be set by regulating the node 146 ("CAL_FB") to a predetermined calibration voltage and a known current limit resistance, for example, across resistor 154 ("$R\_{CAL\_CURRENT\_LIMIT\_RESISTOR}$"). This enables a calibration current to flow through resistor 140 ("$R_{CAL}$"), switch 144 ($Q_3$) and resistor 154 ("$R\_{CAL\_CURRENT\_LIMIT\_RESISTOR}$").

Resistor 140 ("$R_{CAL}$") may be chosen to be the same order of magnitude as the DCR. This may be done, for instance, to calibrate errors which may be associated with the interface circuit 106, as the same circuit is used to measure voltage across capacitor 132 ("$C_b$").

Once DCR measurement and calibration is complete, switches 144 ($Q_3$) and 150 ($Q_4$) may be turned off to effectively isolate the measurement and calibration circuit 108 from the load and power controller/driver 104. Furthermore, the correct output voltage may be programmed into or otherwise set into power controller/driver 104 upon completion of DCR measurement and calibration.

The architecture 100 is shown schematically as a single interconnected unit. For instance, the architecture 100 may comprise an integrated architecture on a single PCB. Alternatively, the architecture 100 may have a modular structure with various components and circuits on different PCBs. By way of example, the buck converter circuit 106, microcontroller 102 and power controller/driver 104 may be fabricated on a single PCB while measurement and calibration circuit 108 may be fabricated as part of a separate PCB that is electrically connected thereto. In another example, the measurement and calibration circuit 108 may be part of a separate chip or module connected to the power supply circuitry, for instance to the node 124 of the buck converter circuit 106. While shown in a single phase implementation, the measurement and calibration circuit 108 may be employed as part of a multi-phase power converter.

Figure 3:
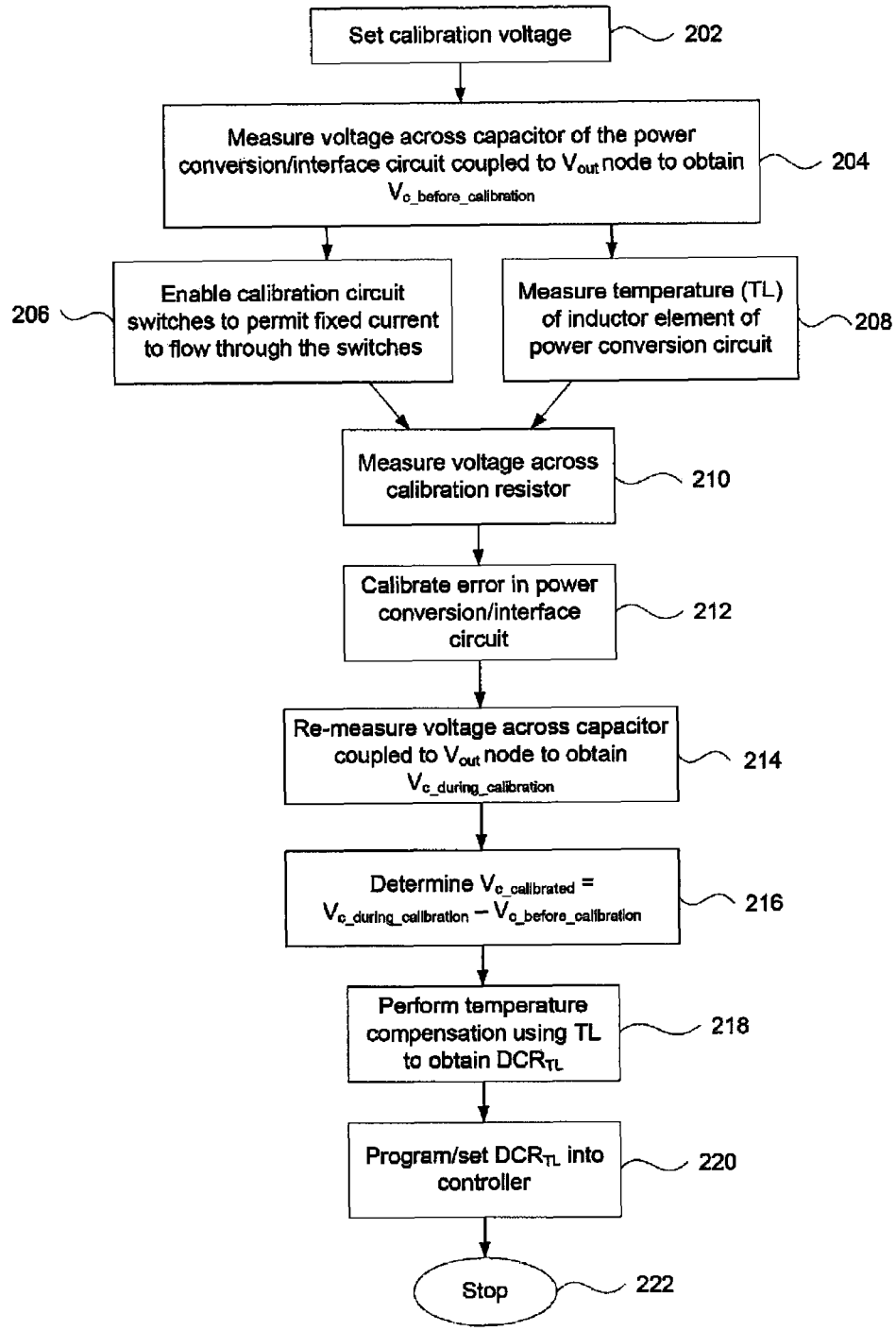
FIG. 3 illustrates a measurement and calibration method in accordance with aspects of the present invention.

FIG. 3 illustrates an exemplary flow diagram 200 of a process in accordance with aspects of the present invention. As shown at block 202, a measurement and calibration process may be initiated by setting a calibration voltage in a current sensing system. This may be done by setting a calibration current and measuring the voltage across the capacitor 132 ($C_b$) which is in series with resistor 120 (Rb). In this series combination, $C_b$ is connected at one side to output node 124 and indirectly at the other side to the node 116, e.g., between nodes 124 and 130, as shown at block 204. This voltage may be referred to as "$V_{c\_before\_calibration}$."

Referring back to FIG. 1, differential amplifier 136 may send the resultant signal to A/D converter 138 so that a digitized signal may be provided to microcontroller 102, or to another controller such as power controller/driver 104.

The process may continue at block 206, where switches 144 and 150 may be enabled with a start calibration signal. This signal may issue from microcontroller 102 or power controller/driver 104. Enabling the switches 144 and 150 permits a fixed current to flow through switch 144. As shown in FIG. 1, this current may be referred to as $I\_{calibrated\_current}$, which is determined by the voltage difference across $R_{CAL}$ ("$CAL\_{FB}$"), i.e., across nodes 124 and 148, and the resistance of resistor 154 ("$R\_{CAL\_CURRENT\_LIMIT\_RESISTOR}$"). The process may also include measuring the temperature ("TL") of inductor 122, as shown in block 208. This may be done concurrently with the actions in block 206, beforehand or afterwards.

Then as shown in block 210, the process may continue by measuring the voltage across resistor 140 ("$R_{cal}$"). Then at block 212, any error in the voltage conversion/interface circuit, e.g., in buck converter circuit 106, is determined and calibrated, such as by arithmetic calculations of known resistors and measured voltages using Ohm's law. While circuit 106 is shown as a buck converter, other voltage conversion circuits may be employed.

Returning to FIG. 3, at block 214 the voltage across capacitor 132 ("$C_b$") and between nodes 124 and 130 is measured again. At this point, the voltage may be referred to as $V_{c\_during\_calibration}$. In block 216 the calibration voltage, $V_{c\_calibrated}$, may be determined by subtracting $V_{c\_before\_calibration}$ from $V_{c\_during\_calibration}$.

Next, as shown by block 218, a temperature-compensated version of $V_{c\_calibrated}$ may be found according to the following equation:

$$DCR_{TL} = V_{c\_calibrated}/I_{\_calibrated\_current}$$

Then, as shown in block 220, $DCR_{TL}$ may be programmed into power controller/driver 104 or microcontroller 102 of FIG. 1. The process may terminate at block 222.

As indicated above, aspects of the invention are not limited to a buck converter circuit but rather may be employed with other circuits which employ a current sensing process. By way of example only, buck, boost, buck-boost and other single or multiphase converter topologies may be configured with a measurement and calibration circuit in accordance with aspects of the present invention. In multiphase applications, each phase may include an inductor. A single measurement and calibration circuit may be applied to each phase.

In many applications, it is desirable to have the DCR as small as possible for efficiency purposes. In many cases the DCR is on the order of 0.001Ω and it may be challenging to accurately measure it. While it is possible to measure the DCR of some boards during manufacturing, there may be a lot of variation of the DCR across the boards produced. Thus, in accordance with aspects of the present invention, the measurement and calibration techniques presented herein measure the resistive voltage drop due to parasitic resistances to get as close as possible to the real current reading at the load (e.g., through node 124 of FIG. 1).

The voltage across the output node is a function of this load line current. In the case where the output voltage is provided to a processor, the processor specifications may require that it operate within a range of voltage and current pairs. The measurement and calibration processes and architectures discussed herein enable accurate regulation of the output current and voltage as they take the various parasitic resistances into account. Measurement and calibration may be done upon startup and/or in real time as temperature and environmental conditions change.

Figure 4:
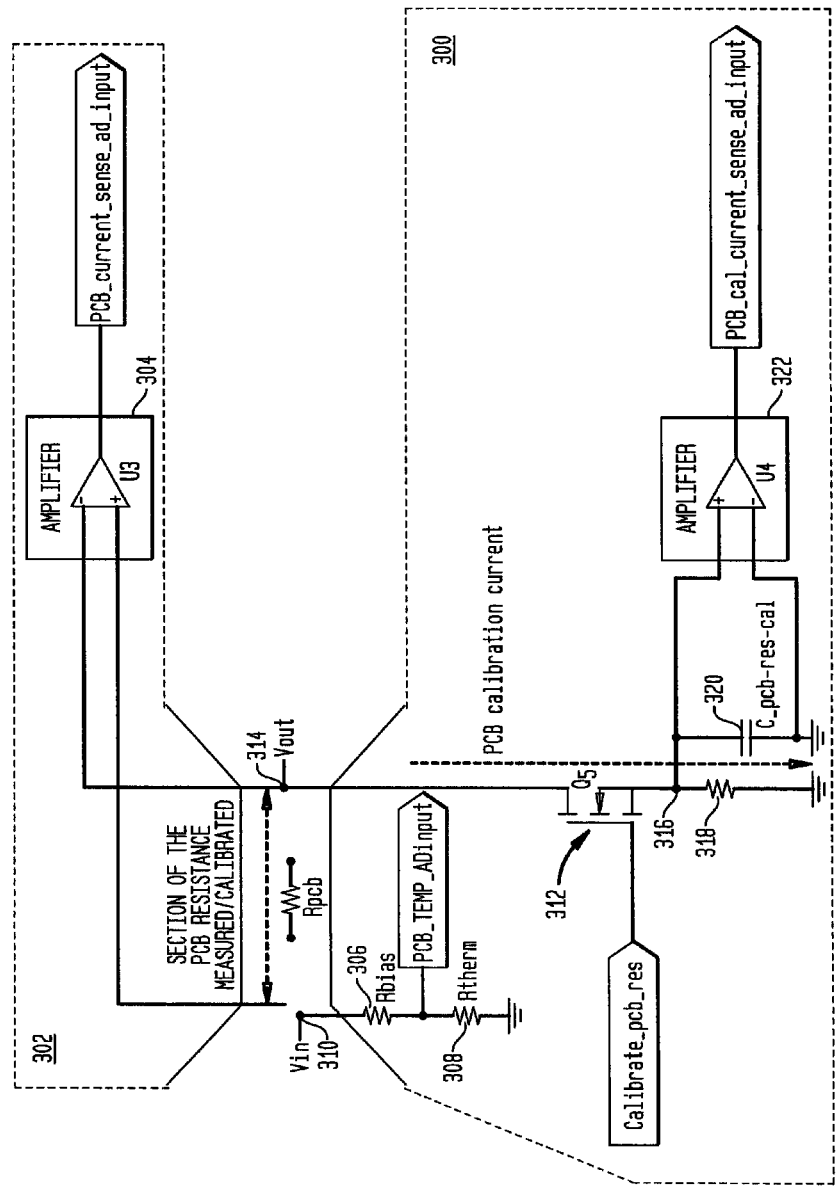
FIG. 4 illustrates another measurement and calibration architecture in accordance with aspects of the present invention.

In accordance with another aspect of the present invention, an alternative measurement and calibration architecture 300 for measuring PCB resistance is shown in FIG. 4. As illustrated in this figure, current may be sensed through a voltage drop across the parasitic PCB resistance, modeled by $R_{pcb}$. As discussed above, PCB resistance varies due to the manufacturing process and temperature. In this example, measurements may be taken between $V_{in}$ and $V_{out}$. The current across the portion of the PCB of interest 302 may be sensed using differential amplifier 304, which outputs a signal PCB_current_sense_ad_input. However, given potential fluctuations in PCB resistance due to manufacture and temperature, such current sensing relying on the differential amplifier 304 may not be accurate enough.

Thus, the measurement and calibration architecture 300 may be employed. As shown, the architecture 300 may include a bias resistor ("$R_{bias}$") 306 and a thermistor ("$R_{therm}$") 308 tied together in series to input node 310. A switching element such as a transistor ("$Q_5$") 312 is tied to output node 314. In the case where the transistor 312 is a MOSFET transistor, the drain is tied to the output node 314. The source of the transistor is tied to a node 316. A resistor ("$R_{\_PCB\_CAL}$") 318 and a capacitor ("$C_{\_pcb-res-cal}$") 320 are both tied at one end to the node 316 and tied at their other ends to ground. A differential amplifier 322 may also be tied to the node 316 and to ground as shown. The differential amplifier 322 outputs a signal named "PCB_cal_current_sense_ad_input."

The resistor 318 ($R_{\_PCB\_CAL}$) provides a known resistance and is connected to the portion of the PCB 302 in a controlled manner. The voltage drop across resistor 318 is the calibration current ("$PCB_{calibration\ current}$"). Once this current is known, measuring the voltage across $R_{pcb}$ gives the PCB resistance. The temperature of the PCB may also be monitored at the time measurement and calibration is performed for proper temperature compensation.

Figure 5:
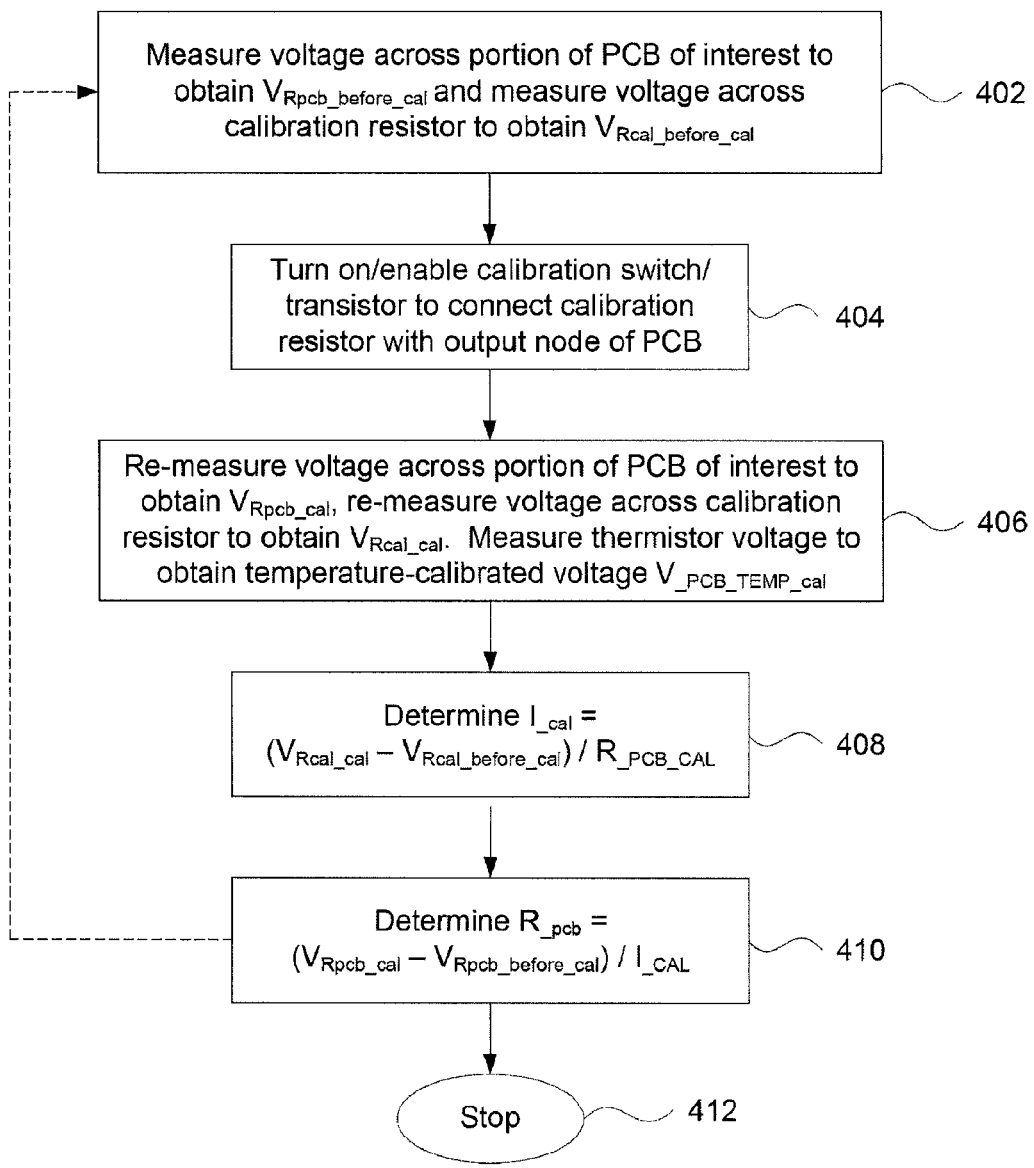
FIG. 5 illustrates another measurement and calibration method in accordance with aspects of the present invention.

An exemplary measurement and calibration process using architecture 300 is provided below and is discussed with regard to flow diagram 400 of FIG. 5. As shown at block 402, this exemplary measurement and calibration process may be initiated by measuring the voltage across the portion of the PCB of interest ("$V_{\_Rpcb\_before\_cal}$") as well as the voltage across the resistor 318 ("$V_{\_Rcal\_before\_cal}$"). Then as shown at block 404, the switch/transistor 312 is turned on, for instance using a Calibrate_pcb_res signal (e.g., applied to the gate of the transistor) as shown in FIG. 4. This connects the resistor 318 to output node 314 and draws a current used for calibration.

Once switch/transistor 312 has been turned on, the voltage across the portion of the PCB of interest ("$V_{\_Rpcb\_cal}$") and the voltage across the resistor 318 ("$V_{Rcal\_cal}$") are re-measured as shown at block 406. Thermistor voltage may also be measured across resistor 308 ($R_{therm}$) at this stage to obtain a temperature-calibrated voltage ("$V_{\_PCB\_TEMP\_cal}$").

Next, at block 408, the calibration current ("$I_{\_cal}$") is determined according to the following equation:

$$I_{cal} = (V_{\_Rcal\_cal} - V_{Rcal\_before\_cal})/R_{\_PCB\_CAL}$$

And as shown at block 410, the PCB resistance at the temperature corresponding to the $V_{PCB\_TEMP\_cal}$ reading is determined according to the following equation:

$$R_{pcb} = (V_{\_Rpcb\_cal} - V_{Rpcb\_before\_cal})/I_{\_cal}$$

This process (e.g., blocks 402-410) may terminate at block 412 or may be repeated one or more times to obtain an average value for $R_{pcb}$. This $R_{pcb}$ value may be used in future current measurements for the portion of the PCB of interest 302. Thus, the obtained $R_{pcb}$ value may be stored in memory for use by a controller or other processor such as controller 102 of FIG. 1.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. Furthermore, while particular processes are shown in a specific order in the appended drawings, such processes are not limited to any particular order unless such order is expressly set forth herein.

The invention claimed is:

1. A method for calibrating a power conversion circuit, the method comprising:
   deriving a pre-calibration voltage associated with a power conversion circuit;
   measuring a voltage across the calibration circuit;
   calibrating an error based on the measured voltage;

obtaining a voltage differential after calibrating for the error; and deriving a calibrated voltage based on the pre-calibration voltage and the obtained voltage differential.

2. The method of claim 1, wherein the method further comprises performing temperature compensation in conjunction with deriving the calibrated voltage.

3. The method of claim 2, further comprising storing temperature compensation information obtained during the temperature compensation in memory.

4. The method of claim 3, further comprising managing operation of the power conversion circuit using the calibrated voltage and the temperature compensation information.

5. An architecture for use with a power conversion device, the architecture comprising:

switching means for permitting current flow; and controller means coupled to a resistance device and the switching means for applying a current to the power conversion device, obtaining a voltage differential to derive a pre-calibration voltage, setting the switching means to permit the current to flow therethrough, measuring a voltage across the resistance device, calibrating an error based on the measured voltage, and deriving a calibrated voltage from a calibration voltage and the pre-calibration voltage.

6. The architecture of claim 5, wherein the controller means is operable to store the calibrated voltage in memory for use during operation of the power conversion circuit.

7. The architecture of claim 6, wherein the controller means is further operable to manage operation of the power conversion circuit using the stored calibrated voltage.

8. The architecture of claim 5, wherein the power conversion device is a single phase buck converter.

9. The architecture of claim 5, wherein the power conversion device is a multi-phase buck converter.

10. The architecture of claim 5, wherein the controller means is further operable to perform temperature compensation for the power conversion device.

11. The architecture of claim 10, wherein the architecture further comprises means for measuring a temperature-compensated resistance for the power conversion device and providing the temperature-compensated resistance to the controller means for the temperature compensation.

12. The architecture of claim 5, wherein the switching means comprises first and second switching elements.

13. The architecture of claim 12, wherein the controller means is further operable to electrically isolate the first and second switching elements from the power conversion device after the calibrated voltage is derived.

14. A method, comprising:

measuring a voltage between input and output nodes of an electronic circuit to derive a first baseline voltage;

measuring a voltage to derive a second baseline voltage;

re-measuring the voltage between the input and output nodes to derive a first calibration voltage;

deriving a second calibration voltage;

determining a calibration current based on the first and second calibration voltages; and determining an effective resistance of a selected section of the electronic circuit.

15. The method of claim 14, further comprising storing the effective resistance in memory.

16. The method of claim 14, further comprising determining an average effective resistance for the electronic circuit.

17. The method of claim 14, further comprising determining a temperature-calibrated voltage.

18. The method of claim 14, further comprising electrically coupling a switching element to a calibration resistor for measuring the second baseline voltage.

19. The method of claim 18, further comprising electrically isolating the electronic circuit from the switching element after the calibrated voltage is derived.

* * * * *